(12) United States Patent
Manger et al.

(10) Patent No.: US 6,956,260 B2
(45) Date of Patent: Oct. 18, 2005

(54) INTEGRATED SEMICONDUCTOR MEMORY WITH WORDLINES CONDUCTIVELY CONNECTED TO ONE ANOTHER IN PAIRS

(75) Inventors: Dirk Manger, Dresden (DE); Till Schlösser, Dresden (DE); Martin Popp, Dresden (DE); Michael Sesterhenn, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/463,019

(22) Filed: Jun. 17, 2003

(65) Prior Publication Data

US 2003/0232470 A1 Dec. 18, 2003

(30) Foreign Application Priority Data

Jun. 17, 2002 (DE) .......................................... 102 26 965

(51) Int. Cl.⁷ ...................... H01L 27/108; H01L 29/76; H01L 29/94; H01L 31/119
(52) U.S. Cl. ...................................................... 257/302
(58) Field of Search ........................................... 257/302

(56) References Cited

U.S. PATENT DOCUMENTS 4,977,436 A * 12/1990 Tsuchiya et al. ............ 257/302
5,519,236 A    5/1996 Ozaki

* cited by examiner

*Primary Examiner*—Howard Weiss
(74) *Attorney, Agent, or Firm*—Laurence A. Greenberg; Werner H. Stemer; Ralph E. Locher

(57) ABSTRACT

In semiconductor memories, in particular DRAMs, the memory cells of which have vertical transistors at vertical lands formed from substrate material, gate electrodes are formed as spacers which run around the land. The gate electrodes of adjacent memory cells conventionally have to be retroactively connected to form word lines. It is known to fill spaces between adjacent lands with an oxide, with the result that the spacers are formed directly as word lines but only cover two side walls of a land. Two transistors which are connected in parallel are formed at these side walls instead of a single transistor, since the gate electrode does not run around the land. The invention proposes a method for fabricating a semiconductor memory in which all four side walls of a land are covered by the word lines and at the same time lands of adjacent memory cells are connected to one another by the word lines.

10 Claims, 5 Drawing Sheets

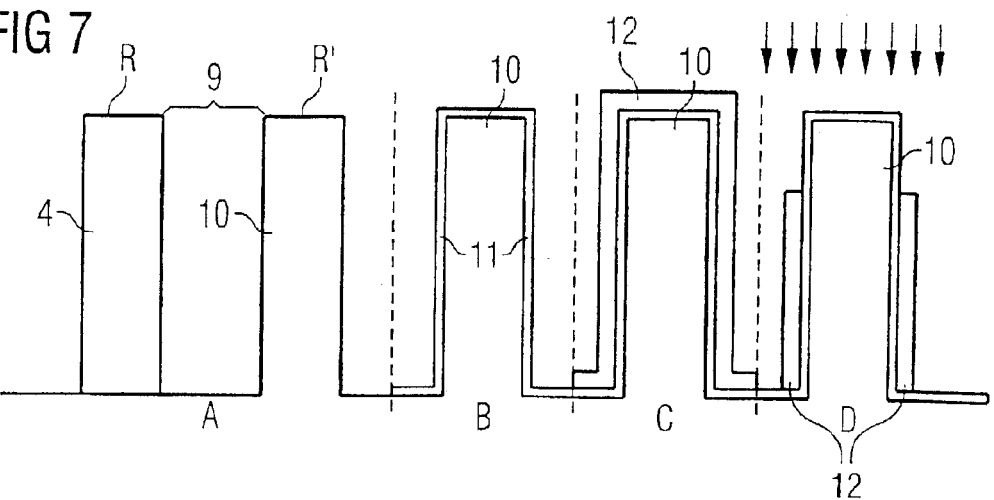
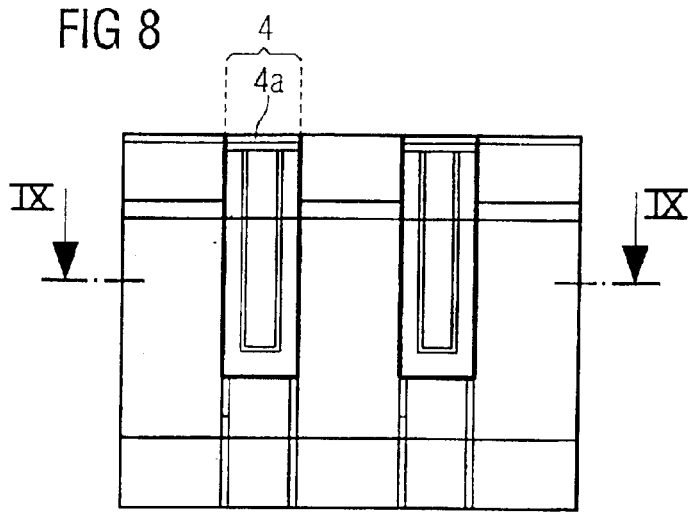
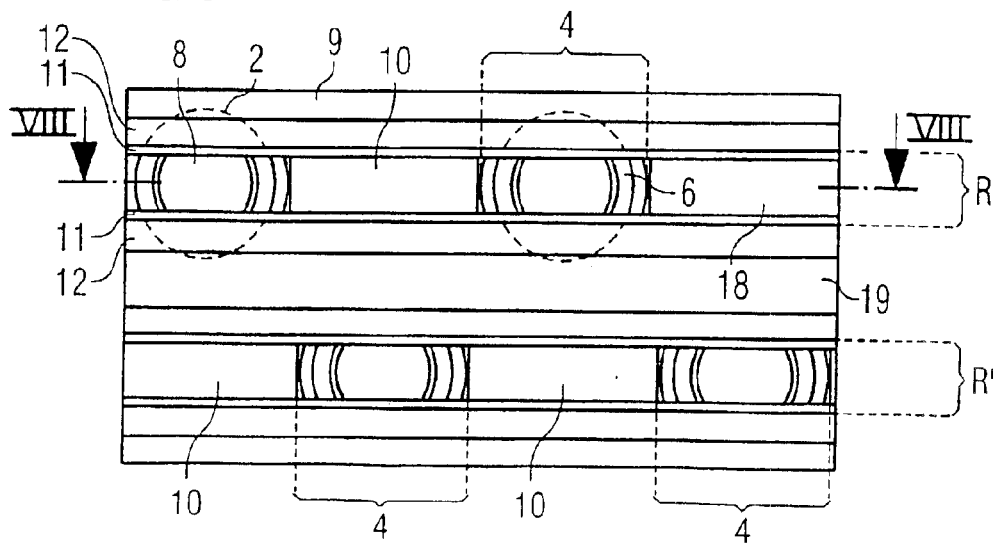

FIG 13
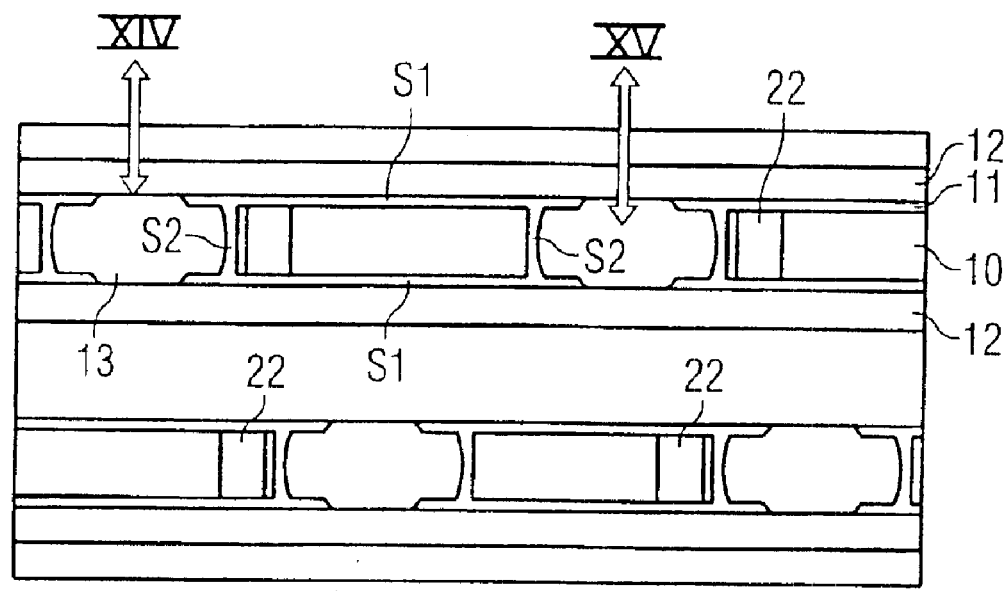
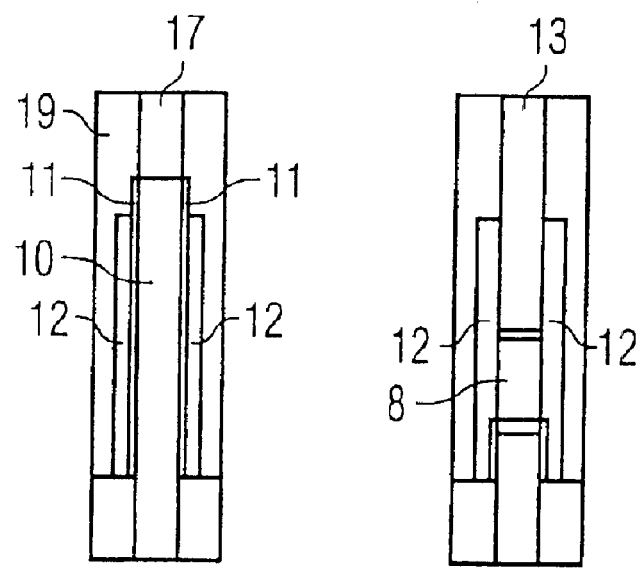
FIG 14    FIG 15

INTEGRATED SEMICONDUCTOR MEMORY WITH WORDLINES CONDUCTIVELY CONNECTED TO ONE ANOTHER IN PAIRS

BACKGROUND OF THE INVENTION

Field of the Invention

The invention relates to an integrated semiconductor memory and to a method for fabricating a semiconductor memory of this type. The integrated semiconductor memory, in general, has memory cells in a semiconductor substrate, each memory cell having a storage capacitor, which is arranged in a trench and above which there is a trench filling having a first, thin insulation layer and a first conductive filling on the inner side of the first insulation layer in the trench. A vertical selection transistor is formed at a land formed from substrate material. Word lines, which are each separated from the land by a second, thin insulation layer, run on two opposite side walls of the land. In each case, the first insulation layer of the trench filling adjoins a further side wall of the land.

Integrated semiconductor memories have a multiplicity of memory cells on a semiconductor substrate, which each have a storage capacitor and a selection transistor for selection of these memory cells. The selection transistors are driven by word lines and bit lines. Buried storage capacitors are produced deep inside trenches which are circular or approximately oval in contour as a result of a dielectric being introduced onto the inner wall of the trench and an inner capacitor electrode being formed therein. The surrounding substrate is used as the outer capacitor electrode. At mid-substrate depth above the storage capacitors there is generally a collar region which is used to make electrical contact with the inner capacitor electrode and otherwise to provide insulation with respect to surrounding electrical structures close to the substrate surface. Above this the selection transistors are formed, often within these trenches but in an upper region.

In another design of selection transistors, the latter are located laterally next to the trenches for the storage capacitors. In a specific design—referred to as a surrounding gate transistor—the selection transistors are vertical transistors which are formed at lands, i.e. vertical columns which are, for example, square or rectangular in cross section. At the side walls, the land has a shell which runs all the way around it or at least covers two opposite side walls and comprises gate electrodes; an upper source/drain electrode is implanted in an upper region, and a lower source/drain electrode is produced in a lower region below the gate electrode by diffusion of a dopant out of the trench capacitor. A thin gate oxide layer is formed between the substrate material in the lands and the lateral gate electrodes, while the channel region of the transistor, preferably of a MOSFET (metal oxide semiconductor field effect transistor), runs in the vertical direction beneath the gate oxide layer but at both opposite or all four side walls.

A problem with forming the transistors designed in this way is the step of forming the word lines which constitute the gate electrodes. Ideally, all four side walls of the lands are covered by the gate electrode, in particular including that side wall of the land which adjoins the trench with the storage capacitor of the same memory cell, where the lower source/drain electrode is formed approximately at the level of the gate electrode lower edge and beneath the gate electrode. However, in the spacer technique, the gate electrodes are formed as side wall coverings, specifically by conformal deposition and subsequent anisotropic etchback in a direction perpendicular to the substrate surface. The material of the gate electrodes or word lines remains in place only on vertical wall of the substrate or of other structures. If the gate electrode is to be formed at all four side walls of a land, the land has to be surrounded by a trench from all four sides. In this case, the spacer technique merely leads to the individual cells being surrounded but not to them being electrically connected to one another. Consequently, the gate electrodes belonging to a row of memory cells have to be subsequently electrically connected by additional structures, i.e. with the aid of further lithographic process steps.

Alternative gate designs for transistors of the above design are described in U.S. Pat. No. 5,519,236. In one embodiment, only two opposite side walls of a land are covered with gate electrodes. No gate electrode is formed at the side wall of the land which adjoins the trench having the storage capacitor of the same memory cell and at the opposite side wall. Instead, at these side walls there is an insulating filling which extends as far as the next land flush in line with the land cross section, so that the gate electrodes can also be deposited on the side walls of these insulating land extensions. Consequently, each land has a left-hand and right-hand word line, with the result that ultimately two parallel-connected selection transistors are formed at each land. Eddy currents between the two transistors lead to switching inaccuracies when the memory cell is driven.

To avoid this disadvantageous switching behavior, it is possible for further columns, along which the right-hand and left-hand word lines likewise extend, to be formed between the adjacent lands. These additional columns, which serve as auxiliary structures, are at only a short distance from the two adjacent lands. Between them there is a gap in which the gate electrode is likewise formed. Each land made from substrate material for forming a vertical transistor is therefore covered with a gate electrode from all four sides, i.e. including toward the adjoining storage trench. Moreover, the gate electrodes are conductively connected to one another in rows along the column-like auxiliary structures, since the spacers are also formed around these structures. A drawback of this arrangement is the additional outlay on time, labor and costs required to form the auxiliary structures.

SUMMARY OF THE INVENTION

It is accordingly an object of the invention to provide an integrated semiconductor memory and a fabrication method which overcome the above-mentioned disadvantages of the heretofore-known devices and methods of this general type and which provide for a semiconductor memory with vertical selection transistors formed at lands in which the gate electrodes are formed at all four side walls of a land and connect adjacent selection transistors to one another in rows to be fabricated as inexpensively as possible.

With the foregoing and other objects in view there is provided, in accordance with the invention, a method of fabricating an integrated semiconductor memory. The novel method comprises the following sequence of steps:

a) forming deep trenches in a semiconductor substrate and producing storage capacitors in a lower region of the deep trenches;

b) introducing trench fillings into an upper region of the trenches, the trench filling which is introduced at the interface with the semiconductor substrate in each case being a first, thin insulation layer and, on the inner side of the latter, a first conductive filling;

c) etching side trenches which run in a first direction between in each case two rows of trench fillings, with the result that lands of substrate material are produced within the rows of trench fillings, between adjacent trench fillings, and with the result that the trench fillings, in a second direction perpendicular to the first direction, are etched on opposite sides, so that the first conductive fillings are uncovered between likewise uncovered side walls of the lands;

d) forming a second, thin insulation layer on the uncovered side walls of the lands and of the first conductive fillings;

e) forming word lines on the second, thin insulation layer and filling the side trenches with an insulating material up to a level above the word lines;

f) etching the trench fillings and the second insulation layer in the region of the deep trenches from the upper side of the semiconductor substrate; and g) producing an electrical connection between the word lines and the first conductive fillings by covering the trench fillings which have been etched from above with a conductive material.

In this method, after the capacitors have been formed, in the deep trenches intended for that purpose, strip-like side trenches of a lower depth than the deep trenches are etched into the substrate. The side trenches in each case run between two rows of capacitor trenches. In an upper region of the capacitor trenches, where the side trenches cross the deep capacitor trenches, the trench fillings are etched clear and removed at the edge. The trench fillings, since they adjoin the substrate material in the land on both sides in a first direction, have a thin first insulation layer on the outside and a first conductive filling on the inner wall of this first insulation layer. During etching of the side trenches, both the first insulation layer and the first conductive filling are removed at the edge.

In each case a land, i.e. a column which is approximately rectangular in cross section and comprises substrate material and in which in each case one selection transistor with a vertical channel region can be formed, is formed between in each case two trench fillings belonging to the same row which have been uncovered on both sides in this way.

Then, a second thin insulation layer is produced along the side walls of the side trenches, i.e. on the side walls of the lands and of the uncovered trench fillings, for example by thermal oxidation or by oxide deposition, before the word lines are formed along the continuous side walls of the side trenches with the aid of the spacer technique. The word lines now run along two opposite side walls of the lands and of the trench fillings and connect lands which are adjacent in the first direction, i.e. adjacent future memory cells beyond the trench fillings of the deep trenches.

In this method, the gate electrodes are not at first formed on the remaining two sides of the lands at the boundary with the adjacent capacitor trenches. Instead, according to the invention, subsequent contact is made between the right-hand and left-hand word lines and also between these word lines and the first conductive fillings which are present at the remaining side walls, with the result that encircling gate electrodes are formed around the lands retrospectively and without the need for additional lithographic process steps. For this purpose, in step f) the trench fillings, in particular the first conductive fillings, and those regions of the second insulation layers which adjoin them, are at least partially removed, i.e. removed down to a certain depth, by an etch from the upper side of the semiconductor substrate. According to the invention, the trench fillings are etched from above, i.e. the trenches of the storage capacitors are opened up again in a top region. During this opening step, the second insulation layer on the inner side of the word lines running on both sides is also removed at least at some locations. At the same time, the first conductive filling is uncovered in that region of the trench filling which faces the land. According to the invention, in step g) this filling is then electrically conductively connected to the gate electrodes on both sides by a further conductive filling comprising a conductive material, with the result that gate electrodes which run around all four sides of the lands are formed without additional lithographic process steps being required.

It is preferable for second conductive fillings to be introduced within the first conductive fillings in step b). According to further embodiments, in step f) the second conductive fillings can be etched to a depth which is below the upper edges of the word lines while the first conductive fillings are only etched to a depth which is above the upper edges of the word lines. In particular, in step f) the first and second conductive fillings are etched simultaneously but at different etching rates. There is provision for the diameter of the inner, second conductive fillings to be wider than the width of the lands, with the result that in step c) not only the first conductive fillings but also the second conductive fillings are etched clear and removed from both sides at the edge. After the word lines have been formed, the second, inner conductive fillings are only separated from the left-hand and right-hand word lines by the thin second insulation layer. However, according to the invention this layer is also removed in step f), preferably down to the same height as the inner conductive fillings. Then, both surfaces of the word lines and surfaces of the first, outer conductive fillings, which were originally in the basic shape of a ring, are then uncovered in the inner region of the trench fillings which has been etched clear in step f). These surfaces are short-circuited in step g). The difference in height between the etches of the outer and inner conductive fillings in the trenches of the storage capacitors makes it possible to make contact between the uncovered inner sides of the right-hand and left-hand word lines and the inner wall of the outer conductive filling which is uncovered within the height difference. Moreover, the outer conductive filling protects the first insulation layer at the land and therefore preferably extends as far as above the upper edge of the word line, preferably also as far as above the substrate material of the lands, which, for reasons of protection against etchant, are covered at the top with a protective layer of a nitride.

In step f) it is preferable for the second insulation layers on the inner sides of the word lines to be removed down to the same depth as the second, inner conductive trench fillings.

In accordance with the spacer technique, in step e) the word lines are formed by a conformal deposition and a subsequent anisotropic etchback perpendicular to the surface of the semiconductor substrate.

With the above and other objects in view there is also provided, in accordance with the invention, a semiconductor memory, in which in each case the two word lines which run at two opposite side walls of a land are electrically conductively connected to the first conductive filling and are short-circuited with one another by the first conductive filling. In this case, although the word line layers only run along two opposite sides of the lands and connect adjacent memory cells to one another, they are also short-circuited with one another by the first conductive fillings, so that gate electrodes which run around at least three side walls of a land are formed. The first conductive filling of a capacitor trench which is arranged next to a land is according to the invention used also to lead the word line potential to the further, narrow side wall of the land, i.e. to the first insulation layer arranged thereon, the gate oxide layer. As a result, the first conductive fillings become part of word line structures. Therefore, a continuous gate electrode is formed at least at three adjacent side walls of the land, so that in the interior of the land, along these three side walls, a transistor channel can be formed between an upper source/drain electrode down to a lower source/drain electrode which connects the selection transistor to the capacitor arranged in the trench; eddy currents no longer occur between the two opposite side walls of the land.

It is preferable for in each case two word lines which run at the same lands to be conductively connected to one another and to the first conductive fillings in the region of cutouts in the second insulation layer. In the region of the trench fillings, the second insulation layers on the inner sides of the word lines are either completely interrupted or alternatively are only recessed in an upper region above the basic area of a capacitor trench.

A further embodiment provides for in each case two word lines which lie on opposite sides of a land to be connected by the trench fillings which adjoin the land to form a gate electrode which runs around the land and surrounds all four side walls of the land. Furthermore, there is provision for the word lines which lie on opposite sides of a land to cross the basic area of the trench for the storage capacitor which adjoins the land.

To form the electrically conductive connection in accordance with the invention between the word lines and the first conductive fillings, there is provision for the second insulation layers to be interrupted in the region of the trench fillings.

In particular, there is provision for the trench fillings, at the depth at which the word lines are arranged, to have second conductive fillings, which directly adjoin the word lines, within the first conductive fillings. These second, inner fillings directly produce an electrical connection. Alternatively, the second conductive fillings can be separated from the first conductive fillings by a thin, third insulation layer which is bridged by the further filling made from a conductive material.

It is preferable for second insulation layers, between the word lines, to extend beyond the lands as far as the first, outer conductive fillings of the trenches and to be recessed only in the region of the second, inner conductive fillings. This is true in particular of the depth region in which only the second, inner conductive fillings but not the first, outer conductive fillings have been removed.

The first and second insulation layers form gate oxide layers and preferably consist of silicon oxide. The first conductive fillings preferably consist of doped polysilicon, the second conductive fillings of undoped polysilicon, which are removed selectively with respect to the outer, first conductive fillings at an etching rate which is between 1.5 times and 5 times greater, i.e. down to an etching depth which is greater by this factor.

Finally, there is provision for the semiconductor memory, in a first direction, to have rows of filled trenches, the lands being arranged in the rows of trenches, between adjacent trenches. In each row of trenches, the lands between them are in each case covered by the word lines on all four side walls.

Other features which are considered as characteristic for the invention are set forth in the appended claims.

Although the invention is illustrated and described herein as embodied in an integrated semiconductor memory and fabrication method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 7 is a vertical section;

FIG. 8 is a section along the line VIII—VIII in FIG. 9;

FIG. 9 is a plan view onto a section taken at the level along the line IX—IX in FIG. 8;

FIG. 13 is a plan view on to a dual-level horizontal section;

FIG. 14 represents a section taken along the double arrow XIV in FIG. 13; and

FIG. 15 represents a section taken along the double arrow XV in FIG. 13.

DESCRIPTION OF THE PREFERRED EMBODIMENTS

Figure 1:
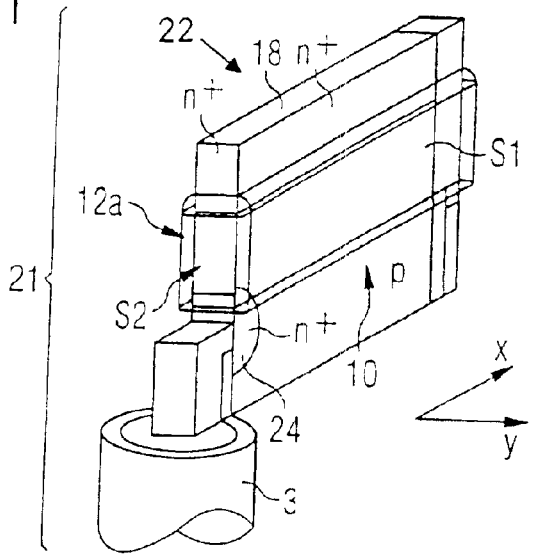
FIG. 1 is a perspective view of an individual memory cell of a semiconductor memory of the generic type.

Referring now to the figures of the drawing in detail and first, particularly, to FIG. 1 thereof, there is shown a memory cell 21, the selection transistor 22 of which is formed at a land 10 made from semiconductor substrate material, also referred to as a semiconductor web or rib 10, and is connected to a storage capacitor 3 via a lower source/drain electrode, which is formed at a narrow side wall S2. The upper source/drain electrode 23 extends over the entire length of the land 10; beneath it, the land 10 is covered on all four side walls by an encircling gate electrode. The land may have a rectangular or square basic area.

Figure 2:
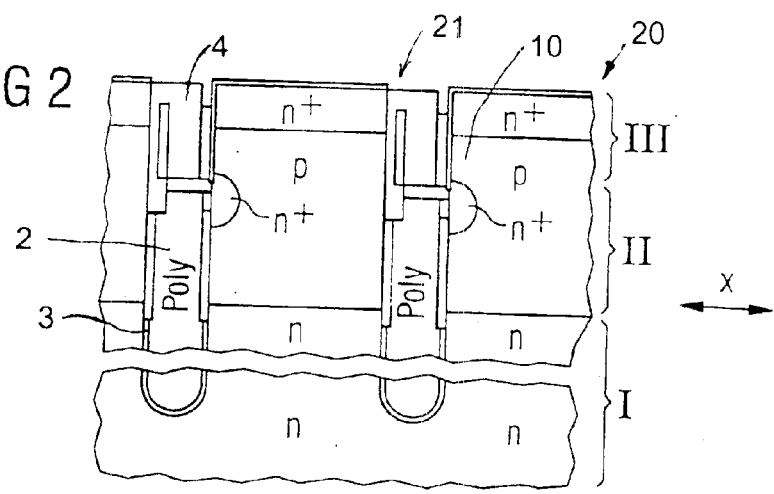
FIG. 2 is a cross section through a semiconductor memory with memory cells as shown in FIG. 1.

FIG. 2 shows a semiconductor memory 20 having a multiplicity of memory cells 21 as shown in FIG. 1 in cross section in the x direction. In the plane of the drawing, which runs in the center of a row of memory cells or trench fillings 4, a land 10, i.e. a column of substrate material, has been formed between two trench fillings 4 of two adjacent trenches 2 or storage capacitors 3.

Figure 3:
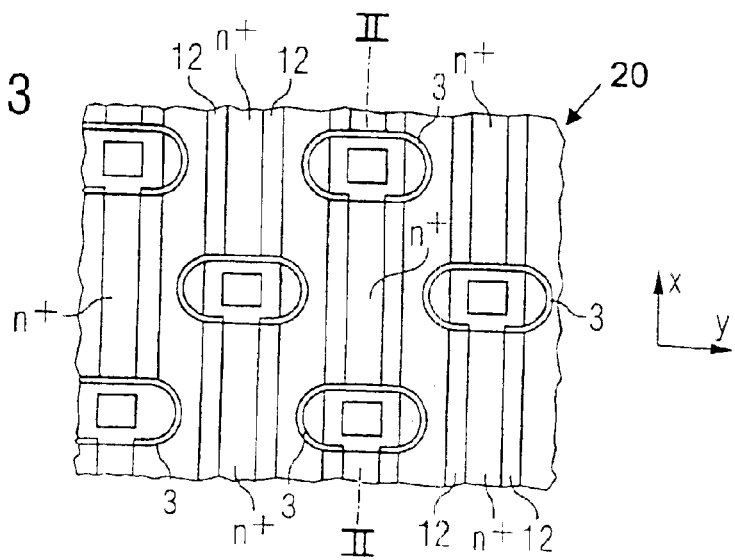
FIG. 3 is a plan view onto the semiconductor memory illustrated in FIG. 2.

FIG. 3 shows a plan view from above of the semiconductor memory shown in FIG. 2. The cross section shown in FIG. 2 runs along the line II—II in FIG. 3. In plan view, it can be seen that all four side walls of the lands 10 are surrounded by gate electrodes 12 which also connect adjacent memory cells to one another in a first direction x. This connection is usually made possible by auxiliary structures 10a which, however, require additional, generally lithographic patterning. According to the invention, a semiconductor memory of this type is fabricated using a method as shown in FIGS. 4 to 14 without the need for auxiliary structures of this type.

Figure 4:
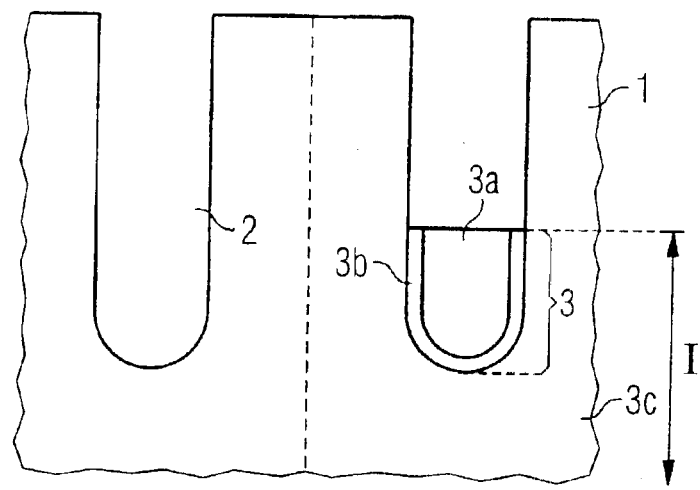
FIG. 4 is a vertical section showing two initial stages in the fabrication process according to the invention.

In accordance with FIG. 4, deep trenches 2 are etched into a semiconductor substrate 1, as illustrated in the left-hand half of FIG. 4, and then, as illustrated in the right-hand half of FIG. 4, storage capacitors with an inner storage electrode 3a, a capacitor dielectric 3b and a doped region 3c of the substrate 1 as outer capacitor electrode are subsequently produced therein. The capacitors are formed only in a lower region I of the deep trenches, and above them there are collar regions 3d of the capacitors, approximately in a central region II illustrated in FIG. 5. In an upper region I, trench fillings 4 are introduced, comprising, from the outside inward, a first, thin insulation layer 5 of silicon oxide, a first conductive filling of doped polysilicon 6, a further thin insulation layer 7 and an inner conductive filling 8 of undoped polysilicon.

Figure 5:
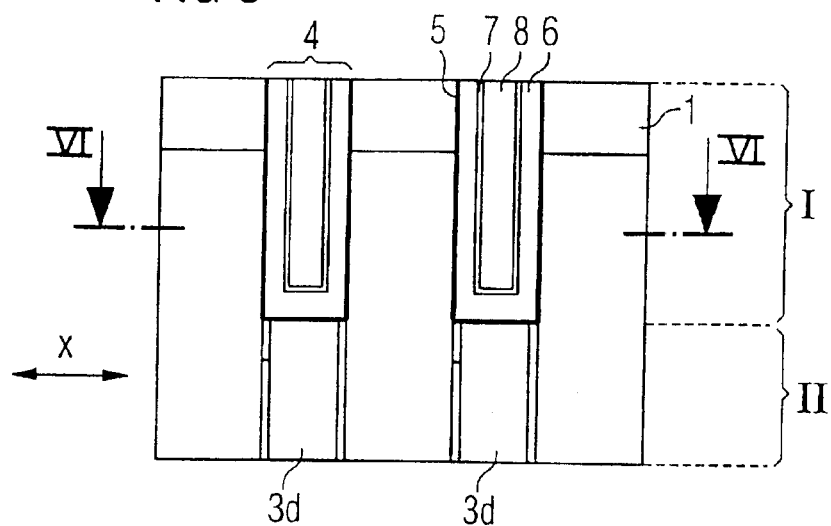
FIG. 5 is a section along the line V—V in FIG. 6 illustrating a further stage in the fabrication process.
Figure 6:
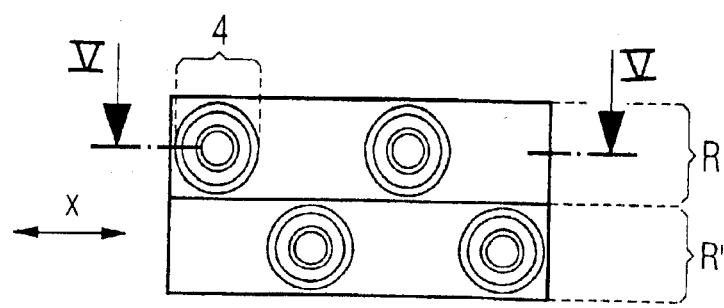
FIG. 6 is a sectional view of a layout at the level of the line VI—VI in FIG. 5.

FIG. 6 shows a plan view of the structure shown in FIG. 5. FIG. 6 corresponds to the basic contour of FIG. 5 at the level of the line VI—VI, whereas FIG. 5 corresponds to a cross section through FIG. 6 along the line V—V. In FIG. 6, it is possible to see two rows R, R' of trenches with storage capacitors running one beneath the other in the direction of line V—V and trench fillings 4 which are arranged above them and extend in the x direction. Then, side trenches, which each have a basic area which extends over the regions 9 and 12 indicated in FIG. 9, are etched from above between the respectively adjacent rows R, R'. It can be seen from FIG. 9 that edge regions are removed from the rows R, R' of trench fillings 4 from two sides, so that only a narrow region of the trench fillings 4 is retained. Lands of substrate material, in each of which a vertical selection transistor is produced, remain in place between adjacent trench fillings of a row.

The etching of side trenches 9 which has been explained in the plan view shown in FIG. 9 in anticipation of the rest of the method will now be described with reference to FIG. 7. In accordance with FIG. 7, first of all side trenches 9 are etched between the rows R, R' of trench fillings, and between these side trenches, depending on the position of the section in the x direction, there are either residues of the trench filling 4 or remaining lands 10. The side trenches 9 extend beyond many memory cells along the x direction perpendicular to the section shown in FIG. 7, region A. As illustrated in region B in FIG. 7, a gate oxide layer 11 is produced, at least in the region of uncovered side walls of the lands 10, on the land grid obtained in this way. Then, in each case one word line 12 is formed at two opposite side walls of each land by conformal deposition of a conductive material 12, as illustrated in region C, and by subsequent anisotropic etchback perpendicular to the surface of the semiconductor substrate 1, as illustrated in region D. Then, the side trenches are covered with an insulating material, for example an oxide such as silicon oxide, as far as the upper edge of the lands and of the trench fillings and are planarized, so that the substrate is at the same height as that illustrated in FIG. 8, including above and below the plane of the drawing illustrated in FIG. 8, where the rows of trench fillings have been removed. Trench coverings 4a which have been temporarily applied to protect the trench fillings 4 can now be removed in order for etches to be carried out in further method steps. The basic contour through the structure shown in FIG. 8 on line IX—IX is illustrated in FIG. 9. The section of FIG. 8, in turn, is taken along the line VIII—VIII FIG. 9.

In FIG. 9, the rows of trench fillings 4 and lands 10 between them are surrounded from two sides by second insulation layers 11 and word lines 12 arranged behind them and formed as side wall covers, i.e. spacers. Between the word lines of adjacent rows R, R' there is insulating material 19 as side trench filling 19 in the trenches 9, which is deposited after the word lines 12 have been formed on the second, thin insulation layer 11 in order to fill the side trenches 9 as far as above the word lines 12. Then, the uncovered upper sides of the multilayer trench fillings are etched back from above in an upper region, in order, in accordance with the invention, to produce conductive connections between the word lines which have hitherto covered only two sides of the lands and the outer trench fillings which cover the remaining, shorter side walls of the lands.

Figure 10:
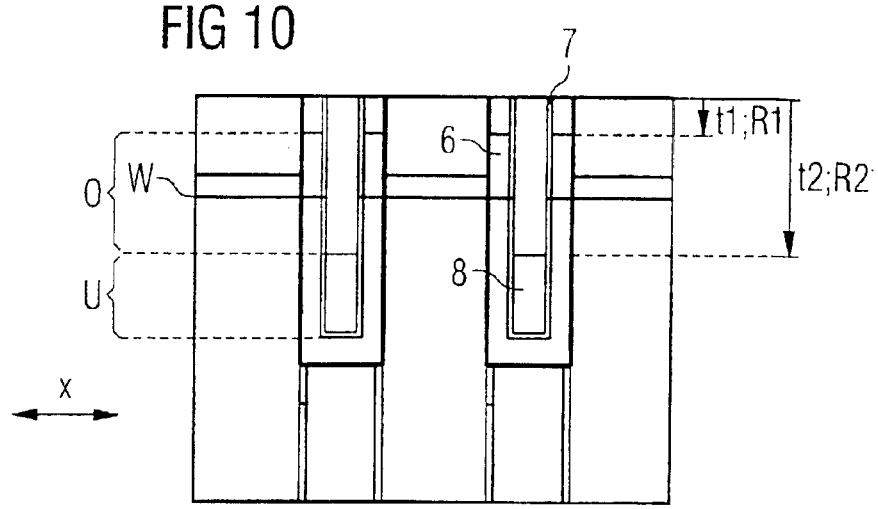
FIG. 10 is a section taken along the x-direction of the array.

For this purpose, as can be seen in FIG. 10, a selective etch is performed, on the basis of different etching rates R1, R2 and etching depths t1, t2 for the first, outer conductive fillings 6 and the inner, second conductive fillings 8, by means of which etch the outer fillings are etched back only to a height which is above the upper edges W of the word lines, whereas the inner fillings 8 are etched back to a greater depth t2 below the upper edges W of the word lines. A thin insulation layer 7 which is optionally present between the outer and inner fillings can be removed separately or at the same time as this etch, so that the inner wall of the outer fillings 6 is uncovered in the region of the height difference O.

Figure 11:
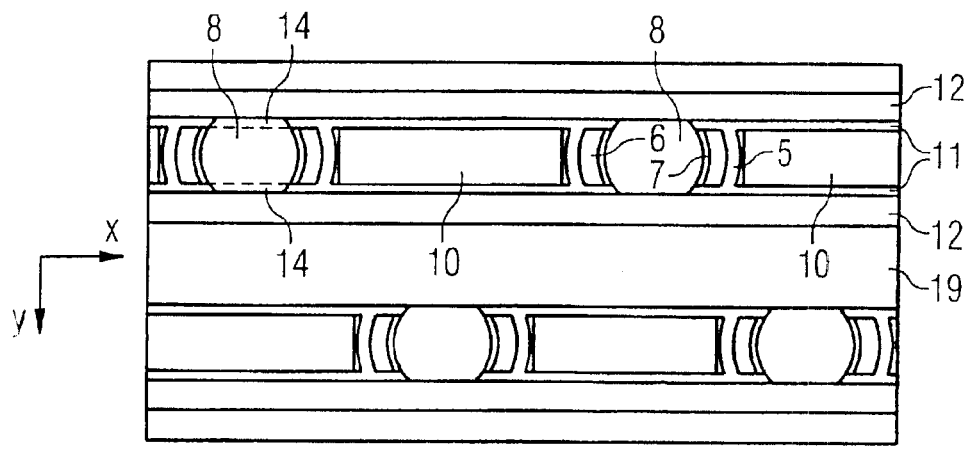
FIG. 11 is a plan view onto the structure of FIG. 10.
Figure 12:
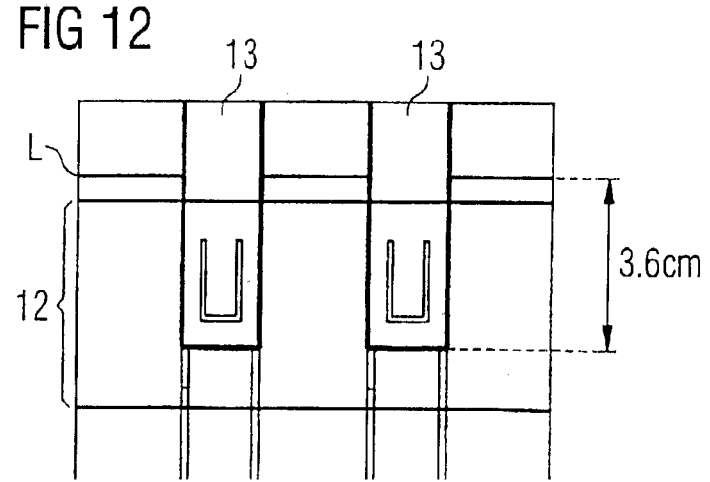
FIG. 12 is a section taken along the y-direction.

FIG. 10 shows the sectional view in the x direction; FIG. 11 illustrates a plan view of FIG. 10. It can be seen that, as provided in step f) of the method according to the invention, not only have the trench fillings 4, or more specifically the inner trench fillings 8 of the trenches, been etched back at the section height shown in FIG. 11, but also so have the regions of the first insulation layers 11 which adjoin the inner fillings 8, so that toward the center of the trenches 4 the inner sides of the word lines 12 are now uncovered and contact can be made with them. Likewise, the outer, first conductive fillings 6 are also uncovered, if appropriate after removal of the third insulation layers 7; in any event, electrical contact can be made with their upper sides at height t1 in accordance with FIG. 10. To conductively connect them to the word lines, a conductive material 13 is now introduced into the trenches from the upper side of the substrate onto the structure shown in FIGS. 10 and 11, from the y direction as illustrated in FIG. 12. Only residues of the (optional) intermediate layer 7 remain; at the height of the line L the result is the plan view shown in FIG. 13, in which above the word lines 12 the trenches 4 are filled with the conductive material 13 over the entire basic area connected by the word lines. The word lines 12, which actually run below the sectional plane illustrated, have also been included in FIG. 13 for the sake of clarity, but contact is made with these word lines by means of sufficiently deep inner regions of the conductive material 13 and by means of the remaining second, inner fillings 8 in the central trench region, where the second insulation layers 11 are interrupted.

In this way, in accordance with the invention, electrical contact is made between the opposite word lines and also between these word lines and the outer conductive fillings at the remaining side walls of the lands; the gate electrodes, which now run around all four side walls S1, S2 of a land, allow optimum control of the selection transistors in particular in those regions 22 of the basic areas of the lands in which the lower source/drain electrodes are formed beneath the gate electrode by diffusion of dopings out of the collar region.

FIGS. 14 and 15 show two sections through the upper word line from FIG. 13 at the level of the double arrows XIV and XV, respectively. The section shown at the level of XIV shows the cross section through a land 10 which is covered on both sides with a thin gate oxide layer and with a word line 12 formed as a spacer. Above the land 10 there is an insulation layer 17, preferably made from a nitride. On both sides of the land, the side trench 9 has been filled with an insulating material 19, for example an oxide. Unlike the section XIV, the section XV does not run through a land, but rather runs through the center of a trench filling 4, which according to the invention has been electrically conductively connected to the word lines 12 on both sides. The inner, second conductive filling 8 is illustrated in a lower region of the trench filling, and the conductive material 13, which above and below the plane of the drawing makes contact with the outer first conductive filling (not shown), is illustrated in an upper region of the trench filling. Both structures 8 and 13 are electrically conductively connected directly to the word lines 12. In this way, the land side walls (not shown in section XIV) are also surrounded by the gate electrode. An improved transistor performance is achieved as a result of the encircling gate electrode, and the substrate potential is prevented from floating in the lands. The method according to the invention is particularly suitable for the fabrication of DRAMs (dynamic random access memory), in particular with a feature size of less than 70 nm.

We claim:

1. An integrated semiconductor memory, comprising:
 a plurality of memory cells in a semiconductor substrate, each said memory cell having:
 a storage capacitor in a trench, a trench filling above said storage capacitor, said trench filling having a first, thin insulation layer with an inner side and a first conductive filling on the inner side of the first insulation layer in said trench;
 a land formed of substrate material and having two mutually opposite side walls and a further side wall;
 a vertical selection transistor formed at said land of substrate material;
 word lines running along said two mutually opposite side walls of said land, and a second, thin insulation layer separating said word lines from said land;
 said first insulation layer of said trench filling adjoining said further side wall of said land;
 said first conductive filling short-circuiting said word lines on said mutually opposite side walls and electrically conductively connecting said word lines; and
 said second insulation layer being formed with cutouts and each two word lines running in common at said land being conductively connected to one another and to said first conductive fillings through said cutouts of said second insulation layer.

2. The semiconductor memory according to claim 1, wherein each two word lines on mutually opposite sides of said land are connected by said trench fillings adjoining said land to form a gate electrode running around said land and surrounding all side walls of said land.

3. The semiconductor memory according to claim 1, wherein said word lines on opposite sides of said land cross a base area of said trench for the storage capacitor adjoining said land.

4. The semiconductor memory according to claim 1, wherein said second insulation layers are interrupted in a region of said trench fillings.

5. The semiconductor memory according to claim 1, wherein said trench fillings, at a depth at which said word lines are disposed, have second conductive fillings directly adjoining said word lines within the first conductive fillings.

6. The semiconductor memory according to claim 5, wherein said second insulation layers, between said word lines, extend beyond said lands and to said first conductive fillings of the trenches and said second insulation layers are only interrupted in a region of said second conductive fillings.

7. The semiconductor memory according to claim 5, which comprises a third insulation layer separating said second conductive fillings from said first conductive fillings in a lower region, and wherein said second conductive fillings are conductively connected to said first conductive fillings in an upper region.

8. The semiconductor memory according to claim 1, wherein the first and second thin insulation layers are gate oxide layers.

9. The semiconductor memory according to claim 1, wherein said first conductive fillings consist of doped polysilicon and said second conductive fillings consist of undoped polysilicon.

10. The semiconductor memory according to claim 1, wherein said semiconductor memory, in a first direction, has rows of filled trenches, and said lands are arranged in the rows of trenches, between mutually adjacent trenches.

* * * * *